US012416657B2

(12) United States Patent
Wang et al.

(10) Patent No.: US 12,416,657 B2
(45) Date of Patent: Sep. 16, 2025

(54) METHOD AND APPARATUS FOR MEASURING ELECTRICAL PROPERTIES OF SAMPLE MATERIAL, DEVICE AND MEDIUM

(71) Applicant: BEIJING INSTITUTE OF NANOENERGY AND NANOSYSTEMS, Beijing (CN)

(72) Inventors: Zhonglin Wang, Beijing (CN); Shiquan Lin, Beijing (CN)

(73) Assignee: BEIJING INSTITUTE OF NANOENERGY AND NANOSYSTEMS, Beijing (CN)

( * ) Notice: Subject to any disclaimer, the term of this patent is extended or adjusted under 35 U.S.C. 154(b) by 127 days.

(21) Appl. No.: 18/259,680

(22) PCT Filed: Nov. 25, 2021

(86) PCT No.: PCT/CN2021/133106
§ 371 (c)(1),
(2) Date: Jun. 28, 2023

(87) PCT Pub. No.: WO2022/183787
PCT Pub. Date: Sep. 9, 2022

(65) Prior Publication Data
US 2024/0053394 A1    Feb. 15, 2024

(30) Foreign Application Priority Data
Mar. 2, 2021    (CN) .......................... 202110232018.4

(51) Int. Cl.
*G01R 29/24*    (2006.01)
*G01R 1/067*    (2006.01)
(Continued)

(52) U.S. Cl.
CPC ......... *G01R 29/24* (2013.01); *G01R 1/06772* (2013.01); *G01R 19/15* (2013.01); *G01R 19/155* (2013.01)

(58) Field of Classification Search
CPC ........ G01Q 60/30; G01Q 60/40; G01R 19/15; G01R 1/06772; G01R 19/155; G01R 29/24
See application file for complete search history.

(56) References Cited

U.S. PATENT DOCUMENTS 4,100,442 A    7/1978  Besocke
6,185,991 B1 *  2/2001  Hong .................... B82Y 35/00
                                              977/851
(Continued)

FOREIGN PATENT DOCUMENTS

CN    101515003 A    8/2009
CN    106443218 A    2/2017
(Continued)

OTHER PUBLICATIONS

International Search Report and Written Opinion for PCT/CN2021/133106 mailed Feb. 28, 2022 with translation of the ISR, 14 pages.
(Continued)

*Primary Examiner* — Feba Pothen
(74) *Attorney, Agent, or Firm* — Myers Bigel, P.A.

(57)    ABSTRACT

A method and an apparatus for measuring an electrical property of a sample material are provided. In the method, an alternating voltage is applied to a piezoelectric ceramic so that a probe fixed on the piezoelectric ceramic vibrates above a surface of the sample material, a target contact potential difference between the probe and the sample material is measured, and a target amplitude of an induced alternating current generated due to the vibration of the probe above the surface of the sample material, a target work function of the surface of the sample material is determined (Continued)

according to the target contact potential difference and a determined work function of the probe, and a target charge density of the surface of the sample material is determined according to the target amplitude, the target contact potential difference, and a pre-stored target amplitude determination function for the induced alternating current.

8 Claims, 11 Drawing Sheets

(51) Int. Cl.
  *G01R 19/15* (2006.01)
  *G01R 19/155* (2006.01)

(56) References Cited

U.S. PATENT DOCUMENTS

| | | |
|---|---|---|
| 2006/0016251 A1 | 1/2006 | Hinterdorfer et al. |
| 2006/0089825 A1 | 4/2006 | Thompson et al. |
| 2009/0307809 A1 | 12/2009 | Ziegler et al. |
| 2010/0043107 A1 | 2/2010 | Proksch |

FOREIGN PATENT DOCUMENTS

| | | |
|---|---|---|
| CN | 107015030 A | 8/2017 |
| CN | 108802431 A | 11/2018 |
| CN | 209745854 U | 12/2019 |
| CN | 110907663 A | 3/2020 |
| CN | 113030602 A | 6/2021 |
| JP | 2006258536 A | 9/2006 |
| JP | 2010038566 A | 2/2010 |
| JP | 2016032006 A | 3/2016 |

OTHER PUBLICATIONS

Lu, Yangfei, et al., "Effect of Surface Charge on the Surface Discharge Evolution for Polymide under High Frequency Voltage", Transactions of China Electrotechnical Society, vol. 33, No. 13, Jul. 31, 2018, pp. 3059-3070, with translated abstract.

Office Action issued in corresponding Japanese Application No. 2022-575465, dated Jan. 9, 2024.

\* cited by examiner

METHOD AND APPARATUS FOR MEASURING ELECTRICAL PROPERTIES OF SAMPLE MATERIAL, DEVICE AND MEDIUM

CROSS-REFERENCE TO RELATED APPLICATION

This application is a Section 371 National Stage Application of International Application No. PCT/CN2021/133106, filed Nov. 25, 2021, which claims priority to Chinese Patent Application No. 202110232018.4, filed Mar. 2, 2021, which are incorporated herein by reference in their entirety.

TECHNICAL FIELD

The present disclosure relates to the field of microscope measurement, in particular to a method and an apparatus for measuring an electrical property of a sample material, a device and a medium.

BACKGROUND

In order to measure microscopic electrical properties of material surfaces, the atomic force microscope (AFM) is provided in the prior art. The atomic force microscope is an instrument commonly used for microscopic characterization, and it is mainly used for measuring a microscopic surface topography of a sample material at first. On the basis of the atomic force microscope, a function of measuring microscopic electrical properties of the surface of the sample material is further added, where the electrical properties include a material surface charge density, a material surface work function, and the like.

Kelvin probe force microscope (KPFM), electrostatic force microscope (EFM) and conductive atomic force microscope (CAFM) which can measure the electrical properties of the material surface are also provided in the prior art.

The KPFM first drives a probe to vibrate with an alternating electrostatic force induced by applying an AC bias voltage, and then applies a DC voltage between the probe and a sample material. When the DC voltage makes an amplitude of a first order vibration frequency at which the probe is vibrated become 0, a magnitude of the DC voltage is equal to a magnitude of a contact potential difference between the sample material and the probe. As such, a charge density of the surface of the sample material is determined according to the contact potential difference and a function between the contact potential difference and the charge density, and a work function of the surface of the sample material is determined according to a difference between a work function of the probe and the contact potential difference. However, the AC bias voltage and the DC voltage applied between the probe and the sample material will affect the electrical properties of the sample material, resulting in an inaccurate measurement result.

In the prior art, the EFM first applies an alternating voltage to a piezoelectric ceramic to cause the piezoelectric ceramic to vibrate, driving a probe fixed on the piezoelectric ceramic to vibrate. An amplitude and a phase of the vibration of the probe may change after the probe is subjected to an electrostatic force of the sample material. A change in the charge density of the material surface may be determined qualitatively according to a change in the amplitude and the phase of the vibration of the probe when the probe is placed at different positions above the surface of the sample material. However, since there is no exact correspondence between the change in the amplitude and the phase of the vibration and a value of the electrostatic force, the EFM can neither accurately determine a magnitude of the electrostatic force and the charge density of the surface of the sample material, nor determine a work function of the surface of the sample material.

In addition, the CAFM in the prior art is mainly used for measuring a conductivity of a material in a micro region, and cannot acquire microscopic electrical properties of the material surface such as the charge density and the work function of the surface of the sample material.

SUMMARY

The present disclosure provides a method and an apparatus for measuring an electrical property of a sample material, a device and a medium, in order to solve a problem that the electrical property of the sample material cannot be accurately determined in the prior art.

The present disclosure provides a method for measuring electrical properties of a sample material, the method including:

applying an alternating voltage on a piezoelectric ceramic so that a probe fixed on the piezoelectric ceramic vibrates above a surface of the sample material;

measuring a target contact potential difference between the probe and the sample material, and determining a target amplitude of an induced alternating current generated due to the vibration of the probe above the surface of the sample material; and determining a target work function of the surface of the sample material according to the target contact potential difference and a determined work function of the probe, and determining a target charge density of the surface of the sample material according to the target amplitude, the target contact potential difference, and a pre-stored target amplitude determination function for the induced alternating current.

Further, the determining a target amplitude of an induced alternating current generated due to the vibration of the probe above the surface of the sample material includes:

measuring a target induced alternating current having a same frequency as a resonant frequency of the probe; and taking an amplitude of the target induced alternating current as the target amplitude.

Further, the determining a target work function of the surface of the sample material according to the target contact potential difference and a determined work function of the probe includes:

determining a difference between the work function of the probe and the target contact potential difference according to the target contact potential difference and the determined work function of the probe, and determining the difference as the target work function of the surface of the sample material.

Further, the determining a target charge density of the surface of the sample material according to the target amplitude, the target contact potential difference, and a pre-stored target amplitude determination function for the induced alternating current includes:

determining the target charge density σ of the surface of the sample material according to the pre-stored target amplitude determination function for the target induced alternating current:

$$A_{charge/\omega} = \left(\frac{1}{\sqrt{1-\left[\frac{A_0}{\frac{d}{\varepsilon}+h}\right]^2}} - 1\right)\frac{2\left(\frac{\sigma d}{\varepsilon} + \varepsilon_0 V_{CPD}\right)S\omega}{A_0},$$

the target amplitude $A_{charge/\omega}$, and the target contact potential difference $V_{CPD}$, wherein h is a predetermined surface topography of the sample material and a preset height between the probe and the sample material, $\omega$ is a determined resonant frequency of the probe, $A_0$ is a determined amplitude of the probe, d is a determined thickness of a dielectric, $\varepsilon_0$ is a determined vacuum dielectric constant, $\varepsilon$ is a determined relative dielectric constant, and S is an equivalent area of a tip of the probe.

Accordingly, the present disclosure provides an apparatus for measuring electrical properties of a sample material, and the apparatus includes:

a control module configured to apply an alternating voltage to a piezoelectric ceramic so that a probe fixed on the piezoelectric ceramic vibrates above a surface of the sample material;

a measurement module configured to measure a target contact potential difference between the probe and the sample material, and determine a target amplitude of an induced alternating current generated due to the vibration of the probe above the surface of the sample material; and a determination module configured to determine a target work function of the surface of the sample material according to the target contact potential difference and a determined work function of the probe, and determine a target charge density of the surface of the sample material according to the target amplitude, the target contact potential difference, and a pre-stored target amplitude determination function for the induced alternating current.

Further, the measurement module is specifically configured to measure a target induced alternating current having a same frequency as a resonant frequency of the probe, and take an amplitude of the target induced alternating current as the target amplitude.

Further, the determination module is specifically configured to determine a difference between the work function of the probe and the target contact potential difference according to the target contact potential difference and the determined work function of the probe, and determine the difference as the target work function of the surface of the sample material.

Further, the determination module is specifically configured to determine the target charge density $\sigma$ of the surface of the sample material according to the pre-stored target amplitude determination function for the target induced alternating current:

$$A_{charge/\omega} = \left(\frac{1}{\sqrt{1-\left[\frac{A_0}{\frac{d}{\varepsilon}+h}\right]^2}} - 1\right)\frac{2\left(\frac{\sigma d}{\varepsilon} + \varepsilon_0 V_{CPD}\right)S\omega}{A_0},$$

the target amplitude $A_{charge/\omega}$, and the target contact potential difference $V_{CPD}$, wherein h is a predetermined surface topography of the sample material and a preset height between the probe and the sample material, $\omega$ is a determined resonant frequency of the probe, $A_0$ is a determined amplitude of the probe, d is a determined thickness of a dielectric, $\varepsilon_0$ is a determined vacuum dielectric constant, $\varepsilon$ is a determined relative dielectric constant, and S is an equivalent area of a tip of the probe.

Accordingly, the present disclosure provides an electronic device including a processor and a memory, where the memory is configured to store program instructions and the processor is configured to implement steps of any one of the above-mentioned methods for measuring electrical properties of a sample material when the program instructions stored in the memory are executed.

Accordingly, the present disclosure provides a non-temporary computer-readable storage medium storing a computer program which, where the computer program, when executed by a processor, implements steps of any one of the above-mentioned methods for measuring electrical properties of a sample material.

The present disclosure provides a method and an apparatus for measuring electrical properties of a sample material, a device and a medium. In the method, an alternating voltage is applied to a piezoelectric ceramic, so that a probe fixed on the piezoelectric ceramic vibrates above the surface of the sample material. When the probe vibrates above the surface of the sample material, a capacitance between the probe and the sample material changes, and charges of the surface of the sample material induce an induced alternating current between the probe and the sample material. A target charge density of the surface of the sample material is determined according to a target amplitude of the induced alternating current, a measured target contact potential difference between the probe and the sample material, and a pre-stored target amplitude determination function for the induced alternating current. A target work function of the surface of the sample material is determined according to the target contact potential difference and a determined work function of the probe. Since there is no need to apply an AC bias voltage or a DC voltage between the probe and the sample material, and the target charge density is determined according to the determined target amplitude determination function for the induced alternating current, it is possible to improve the accuracy in determining the target work function and the target charge density of the surface of the sample material.

BRIEF DESCRIPTION OF THE DRAWINGS

In order to illustrate the technical solutions in embodiments of the present disclosure more clearly, the drawings needed to be used in the description of the embodiments will be briefly introduced below. Obviously, the drawings in the description below are only some embodiments of the present disclosure, and to those skilled in the art, other drawings may be obtained according to these drawings without inventive effort.

DETAILED DESCRIPTION OF EMBODIMENTS

In order to make the objects, technical solutions and advantages of the present disclosure more apparent, the present disclosure will be described in further detail with reference to the drawings. Obviously, the described embodiments are only some, but not all, embodiments of the present disclosure. Based on the embodiments of the present disclosure, all other embodiments, which may be obtained by those skilled in the art without any inventive effort, fall into the protection scope of the present disclosure.

In order to improve the accuracy in determining electrical properties of a sample material, embodiments of the present disclosure provide a method and an apparatus for measuring electrical properties of a sample material, a device, and a medium.

Embodiment 1

Figure 1:
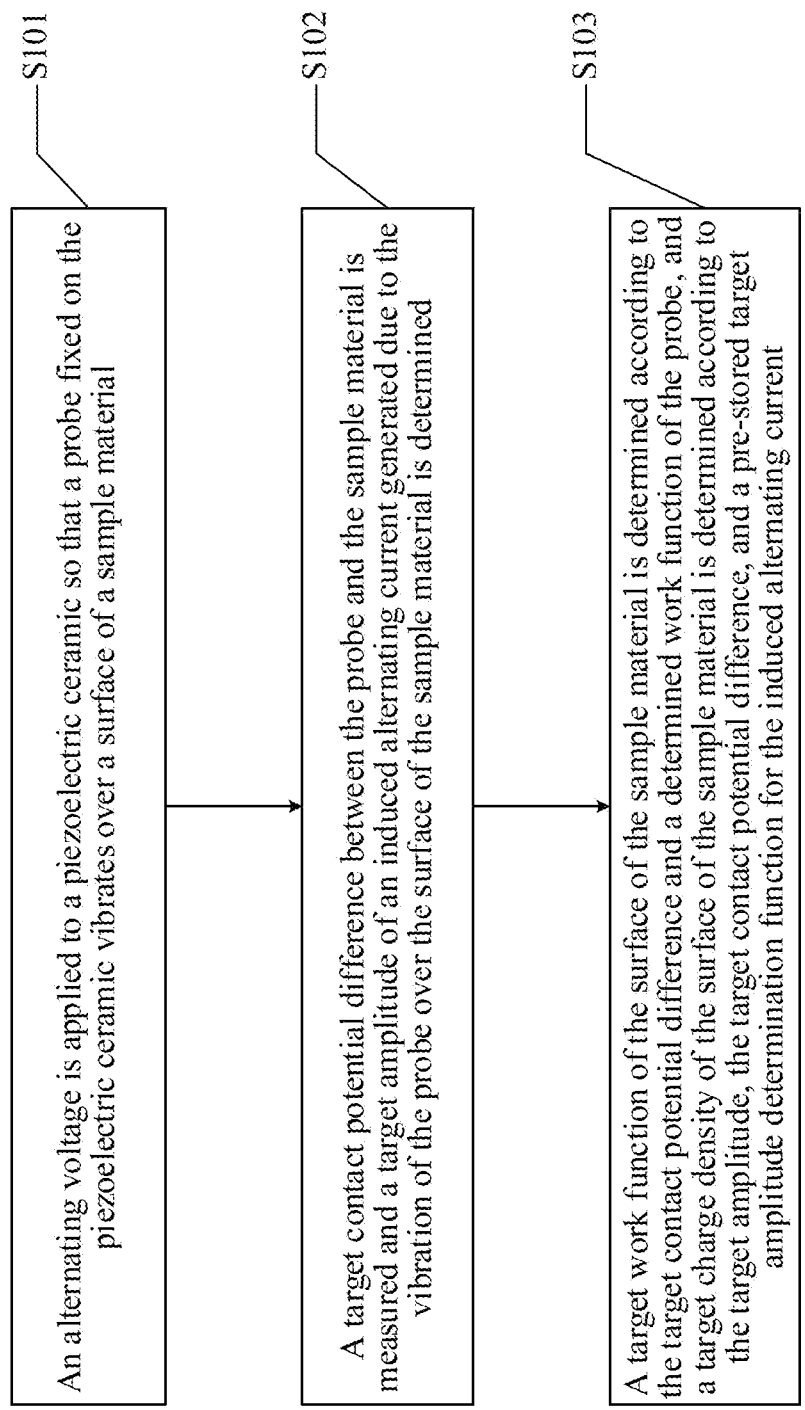
FIG. 1 shows a schematic diagram of a process of a method for measuring electrical properties of a sample material according to an embodiment of the present disclosure.

FIG. 1 shows a schematic diagram of a process of a method for measuring electrical properties of a sample material according to an embodiment of the present disclosure. The process of the method includes the following steps.

In S101, an alternating voltage is applied to a piezoelectric ceramic, so that a probe fixed on the piezoelectric ceramic vibrates above a surface of a sample material.

The method for measuring electrical properties of a sample material according to the embodiments of the present disclosure may be applied to an electronic device, where the electronic device may be a microscope itself, or a control device of the microscope.

In order to measure the electrical properties of the surface of the sample material, in the embodiments of the present disclosure, the electronic device applies an alternating voltage to the piezoelectric ceramic. Due to the inverse piezoelectric effect of the piezoelectric ceramic, the piezoelectric ceramic may deform when subjected to the alternating voltage, and since the probe is fixed on the piezoelectric ceramic, the deformation of the piezoelectric ceramic may drive the probe to vibrate above the surface of the sample material.

The piezoelectric ceramic in the microscope generally has a length between 1 mm and 8 mm, a width between 1 mm and 4 mm, and a thickness between 1 mm and 3 mm. The probe is a commercial conductive probe, and a radius of a tip of the probe is between tens of nanometers and several micrometers. The probe may be a probe coated with a metal thin film, a probe coated with conductive diamond, or an all-metal probe, which is not limited in the embodiments of the present disclosure.

Specifically, the electronic device controls the probe to vibrate at a set height h from a surface topography of the sample material according to a determined surface topography of the sample material, and the set height h is generally in a range of 0 μm to 1 μm. The method for controlling the probe at the set height h from the surface topography of the sample material is present in the prior art, and details will not be repeated in the embodiments of the present disclosure.

A method for determining the surface topography of the sample material may be an existing contact mode determination method or an existing peak force tapping mode determination method, and details will not be repeated in the embodiments of the present disclosure.

In S102, a target contact potential difference between the probe and the sample material is measured, and a target amplitude of an induced alternating current generated due to the vibration of the probe above the surface of the sample material is determined.

When the probe vibrates above the surface of the sample material, the capacitance between the probe and the sample material changes, and charges of the surface of the sample material may induce an inducted alternating current between the probe and the sample material. The electronic device measures the target contact potential difference between the probe and the sample material caused by the inducted alternating current and determines the target amplitude of the inducted alternating current.

Specifically, in the case where the electronic device is a microscope, the microscope includes a current measurement module and a lock-in amplifier inside, where the current measurement module of the microscope measures an obtained induced alternating current, and the lock-in amplifier of the microscope determines the target contact potential difference and the target amplitude of the induced alternating current according to the input induced alternating current.

In the case where the electronic device is a control device of the microscope, the electronic device controls the current measurement module of the microscope to measure the obtained induced alternating current, and controls the lock-in amplifier of the microscope to determine the target contact potential difference and the target amplitude of the induced alternating current according to the input induced alternating current.

In S103, a target work function of the surface of the sample material is determined according to the target contact potential difference and a determined work function of the probe, and a target charge density of the surface of the sample material is determined according to the target amplitude, the target contact potential difference, and a pre-stored target amplitude determination function for the induced alternating current.

After the target contact potential difference between the probe and the sample material is determined, a target work function of the surface of the sample material may be determined according to the target contact potential difference and the determined work function of the probe. The work function refers to the minimum energy needed to move an electron from the inside of a solid to a surface of the solid.

The method for determining the target work function of the surface of the sample material according to the target contact potential difference between the probe and the sample material and the work function of the probe is present in the prior art, and details will not be repeated in the embodiments of the present disclosure.

After the target amplitude and the target contact potential difference of the induced current between the probe and the sample material are determined, in order to determine the target charge density of the surface of the sample material, the target amplitude determination function for the probe and the surface of the sample material is also pre-stored, and when the determined target amplitude and the target contact potential difference are substituted into the target amplitude determination function, the target charge density of the surface of the sample material may be determined.

In the embodiments of the present disclosure, an alternating voltage is applied to the piezoelectric ceramic, so that the probe fixed on the piezoelectric ceramic vibrates above the surface of the sample material. When the probe vibrates above the surface of the sample material, a capacitance between the probe and the sample material changes, and charges of the sample surface may induce an induced alternating current between the probe and the sample material. The target charge density of the surface of the sample material is determined according to the target amplitude of the induced alternating current, the measured target contact potential difference between the probe and the sample material, and the pre-stored target amplitude determination function for the induced alternating current. The target work function of the surface of the sample material is determined according to the target contact potential difference and the determined work function of the probe. Since there is no need to apply an AC bias voltage or a DC voltage between the probe and the sample material, and the target charge density is determined according to the determined target amplitude determination function for the induced alternating current, it is possible to improve the accuracy in determining the target work function and the target charge density of the surface of the sample material.

Embodiment 2

In order to determine the target amplitude of the induced alternating current generated due to the vibration of the probe above the surface of the sample material, on the basis of the above-mentioned embodiment, in an embodiment of the present disclosure, that the target amplitude of the induced alternating current generated due to the vibration of the probe above the surface of the sample material is determined includes the following steps.

A target induced alternating current having a same frequency as a resonant frequency of the probe is measured; and an amplitude of the target induced alternating current is taken as the target amplitude.

In order to determine the target amplitude of the induced alternating current generated due to the vibration of the probe above the surface of the sample material, in the embodiments of the present disclosure, the electronic device measures an induced alternating current at each frequency generated between the probe and the surface of the sample material, then determines a target induced alternating current having the same frequency as the resonant frequency of the probe according to each frequency of the induced alternating current, and takes the amplitude of the target induced alternating current as the target amplitude.

Figure 2:
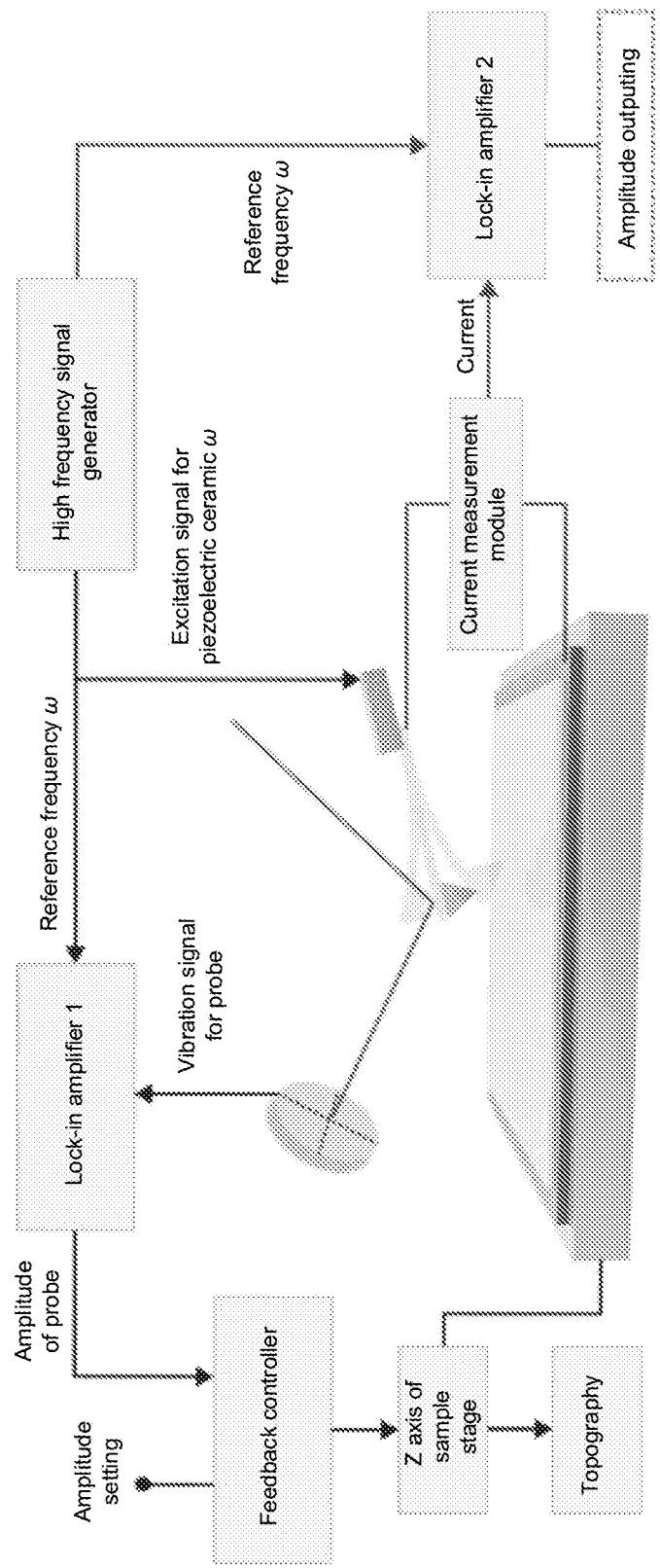
FIG. 2 shows a schematic diagram of a microscope according to an embodiment of the present disclosure.

FIG. 2 shows a schematic diagram of a microscope according to an embodiment of the present disclosure. As shown in FIG. 2, the microscope includes a high frequency signal generator, a current measurement module, and a lock-in amplifier 2. The high frequency signal generator outputs an alternating voltage with a frequency ω and applies the alternating voltage to the piezoelectric ceramic, where the frequency ω of the alternating voltage is the same as the resonant frequency of the probe, so that the probe fixed to the piezoelectric ceramic vibrates above the surface of the sample material, generating the induced alternating current between the probe and the surface of the sample material.

When the probe vibrates above the surface of the sample material, since the vibration may cause a scanning position of the probe on the sample material to be changed, that is, a vertical position of the tip of the probe to the sample material may be changed, where a magnitude of the position change is generally within 200 μm.

The alternating voltage generated by the signal generator may has a frequency in a range of several kilohertz to several megahertz, the probe has a resonant frequency generally between several kilohertz and several hundred kilohertz, and the current measurement module has a measurement resolution for currents in a femtoamp (fA) order.

In the case where the electronic device is the microscope, the current measurement module of the microscope measures the target induced alternating current having the same frequency as the resonant frequency of the probe, and inputs the target induced alternating current into the lock-in amplifier 2 to determine the amplitude of the target induced alternating current.

In the case where the electronic device is the control device of the microscope, the control device controls the current measurement module of the microscope to measure the target induced alternating current having the same frequency as the resonant frequency of the probe, and inputs the target induced alternating current into the lock-in amplifier 2 to determine the amplitude of the target induced alternating current.

The microscope shown in FIG. 2 further includes a lock-in amplifier 1 and a feedback controller, where the lock-in amplifier 1 and the feedback controller are used to determine the surface topography of the sample material. In an embodiment of the present disclosure, the method for determining the surface topography of the sample material is an existing tapping mode determination method.

Specifically, the high frequency signal generator of the microscope outputs the alternating voltage with the frequency ω and applies the alternating voltage to the piezoelectric ceramic, so that the probe fixed on the piezoelectric ceramic vibrates above the surface of the sample material. A vibration signal generated due to the vibration and the frequency ω of the alternating voltage are input into the lock-in amplifier 1. The lock-in amplifier 1 determines an amplitude of the probe and send the amplitude to the feedback controller. The feedback controller adjusts a height of a platform where the sample material is placed according to the amplitude, so that a distance between the probe and the sample material is a preset fixed value. The surface topography of the sample material may be determined according to a change in the Z axis of the platform.

Embodiment 3

In order to determine the target work function of the surface of the sample material, on the basis of the above-mentioned embodiments, in an embodiment of the present disclosure, that the target work function of the surface of the sample material is determined according to the target contact potential difference and the determined work function of the probe includes the following step.

A difference between the work function of the probe and the target contact potential difference is determined according to the target contact potential difference and the determined work function of the probe, and the difference is determined as the target work function of the surface of the sample material.

In order to determine the target work function of the surface of the sample material, in an embodiment of the present disclosure, the electronic device pre-stores the work function of the probe, where the work function of the probe has already been determined. If the probe is made of pure gold, the work function of the pure gold probe is 5.1, and if the probe is made of pure platinum, the work function of the pure platinum probe is 5.65.

Since the target contact potential difference of the induced alternating current between the probe and the surface of the sample material is equal to the difference between the work function of the probe and the target work function of the sample material, the difference between the work function of the probe and the target contact potential difference is determined according to the target contact potential difference and the determined work function of the probe, and the difference between the work function of the probe and the target contact potential difference is determined as the target work function of the surface of the sample material.

Embodiment 4

In order to determine the target charge density of the surface of the sample material, on the basis of the above-mentioned embodiments, in an embodiment of the present disclosure, that the target charge density of the surface of the sample material is determined according to the target amplitude, the target contact potential difference, and the pre-stored target amplitude determination function for the target induced alternating current includes the following step.

The target charge density σ of the surface of the sample material is determined according to the pre-stored target amplitude determination function for the target induced alternating current:

$$A_{charge/\omega} = \left( \frac{1}{\sqrt{1 - \left(\frac{A_0}{\frac{d}{\varepsilon} + h}\right)^2}} - 1 \right) \frac{2\left(\frac{\sigma d}{\varepsilon} + \varepsilon_0 V_{CPD}\right) S\omega}{A_0},$$

the target amplitude $A_{charge/\omega}$, and the target contact potential difference $V_{CPD}$, where h is a predetermined surface topography of the sample material and a preset height between the probe and the sample material, ω is the determined resonant frequency of the probe, $A_0$ is the determined amplitude of the probe, d is a determined thickness of a dielectric, $\varepsilon_0$ is the determined vacuum dielectric constant, ε is a determined relative dielectric constant, and S is an equivalent area of the tip of the probe.

In order to determine the target charge density of the surface of the sample material, in the embodiments of the present disclosure, the electronic device pre-stores the target amplitude determination function for the target induced alternating current generated between the probe and the surface of the sample material. The target amplitude determination function is:

$$A_{charge/\omega} = \left( \frac{1}{\sqrt{1 - \left(\frac{A_0}{\frac{d}{\varepsilon} + h}\right)^2}} - 1 \right) \frac{2\left(\frac{\sigma d}{\varepsilon} + \varepsilon_0 V_{CPD}\right) S\omega}{A_0},$$

where $A_{charge/\omega}$, is the target amplitude of the target induced alternating current, and $V_{CPD}$ is the target contact potential difference of the target induced alternating current, σ is the target charge density of the surface of the sample material, h is the predetermined surface topography of the sample material and the preset height between the probe and the sample material, ω is the determined resonant frequency of the probe, $A_0$ is the determined amplitude of the probe, d is the determined thickness of the dielectric, $\varepsilon_0$ is the determined vacuum dielectric constant, ε is the determined relative dielectric constant, and S is the equivalent area of the tip of the probe.

After the electronic device determines the target amplitude and the target contact potential difference of the target induced alternating current between the probe and the surface of the sample material, the target amplitude and the target contact potential difference are substituted into the above-mentioned target amplitude determination function, so that the target charge density of the surface of the sample material is determined.

Figure 3:
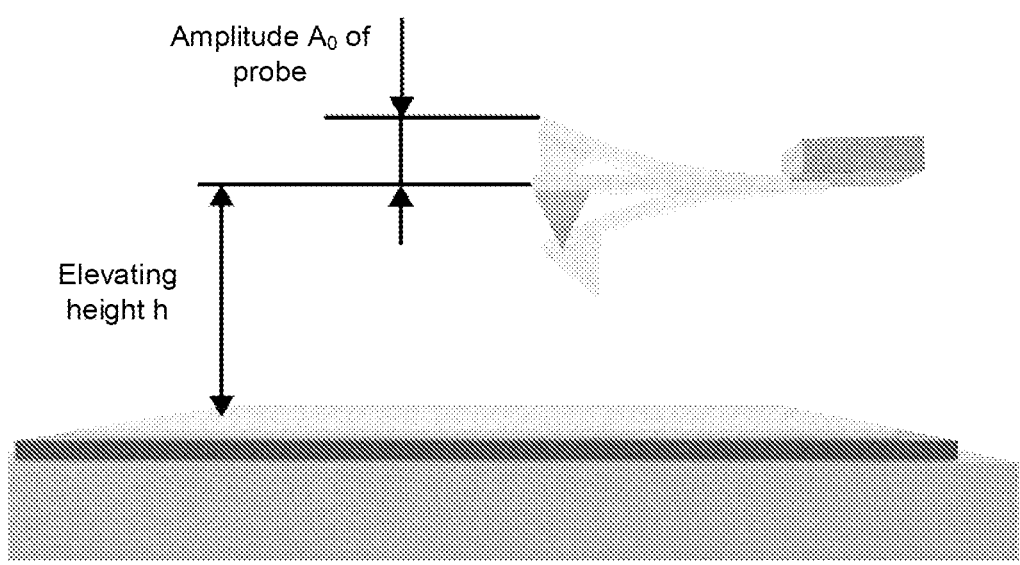
FIG. 3 shows a capacitor model of a probe and a sample material according to an embodiment of the present disclosure.

FIG. 3 shows a capacitor model of a probe and a sample material according to an embodiment of the present disclosure. As shown in FIG. 3, the probe performs a simple harmonic vibration at an elevating height h over the sample surface, with a vibration frequency ω and a vibration amplitude $A_0$. The probe and the sample may be regarded as a capacitor, and since the vibration of the probe above the surface of the sample material is a simple harmonic vibration, according to the elevating height of the probe, the vibration frequency, and the amplitude of the probe, a distance x(t) between a surface of the probe and a surface of a dielectric of the sample may be obtained, where x(t)=h+$A_0$ sin(ωt).

Figure 4:
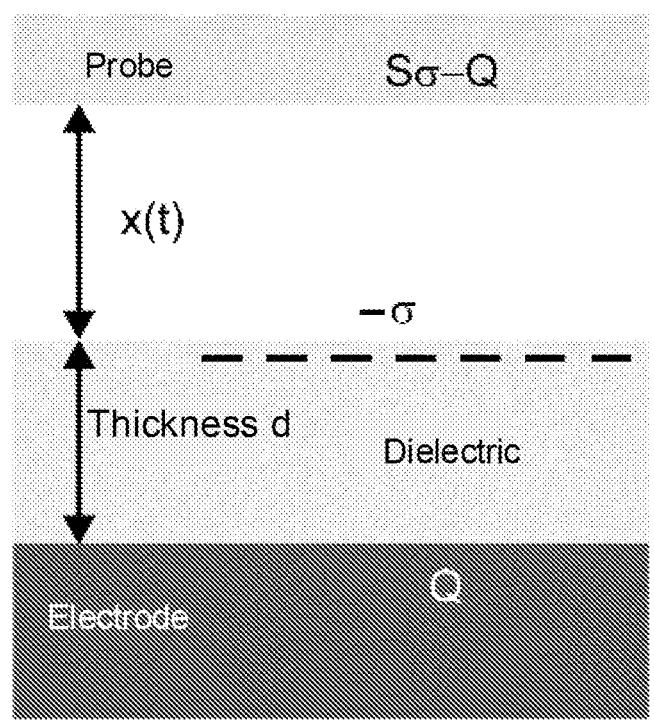
FIG. 4 shows another capacitor model of a probe and a sample material according to an embodiment of the present disclosure.

FIG. 4 shows another capacitor model of a probe and a sample material according to an embodiment of the present disclosure. As shown in FIG. 4, a thickness of a dielectric of the surface of the sample material is d, and an area of a surface the probe is S. Assuming that a charge density of the surface of the sample material is −σ, a charge density of the surface of the probe is (Sσ−Q), and a charge density of a surface of a base electrode of the sample material may be obtained as Q according to Gauss's theorem.

From the capacitor model in FIG. 4, in combination with Gauss's theorem, a target contact potential difference of a target induced alternating current between the probe and the surface of the sample material may be obtained as $$V_{CPD} = -\frac{Q}{S\varepsilon_0}\left(\frac{d}{\varepsilon} + h + A_0 \sin(\omega t)\right) + \frac{\sigma(h + A_0 \sin(\omega t))}{\varepsilon_0},$$

where $\varepsilon_0$ is the determined vacuum dielectric constant, and ε is a determined relative dielectric constant.

From the above-mentioned functional relationship of the target contact potential difference, the following Equation 1 may be obtained:

$$\frac{Q}{s} = \frac{\sigma(h + A_0 \sin(\omega t)) - \varepsilon_0 V_{CPD}}{\frac{d}{\varepsilon} + h + A_0 \sin(\omega t)},$$

and by performing derivation on Equation 1, the following Equation 2 may be obtained:

$$j(t) = \left(\frac{Q}{S}\right)' = \frac{\left(\frac{\sigma d}{\varepsilon} + \varepsilon_0 V_{CPD}\right) A_0 \omega \cos(\omega t)}{\left(\frac{d}{\varepsilon} + h + A_0 \sin(\omega t)\right)^2},$$

where j(t) is a current density of an induced alternating current generated between the probe and the base electrode of the sample material. By performing a Fourier transform on Equation 2, the current density j(t)/ω of the target induced alternating current between the probe and the sample material may be determined according to:

$$j(t)/\omega = \left(\frac{1}{1 - \left(\frac{A_0}{\frac{d}{\varepsilon} + h}\right)^2} - 1\right) \frac{2\omega\left(\frac{\sigma d}{\varepsilon} + \varepsilon_0 V_{CPD}\right)}{A_0} \cos(\omega t),$$

where the frequency of the target induced alternating current is the resonant frequency ω of the probe. Accordingly, the target amplitude $A_{charge/\omega}$ of the target induced alternating current generated between the probe and the sample material may be determined according to:

$$A_{charge/\omega} = \left(\frac{1}{\sqrt{1 - \left(\frac{A_0}{\frac{d}{\varepsilon} + h}\right)^2}} - 1\right) \frac{2\left(\frac{\sigma d}{\varepsilon} + \varepsilon_0 V_{CPD}\right) S \omega}{A_0}.$$

Figure 5:
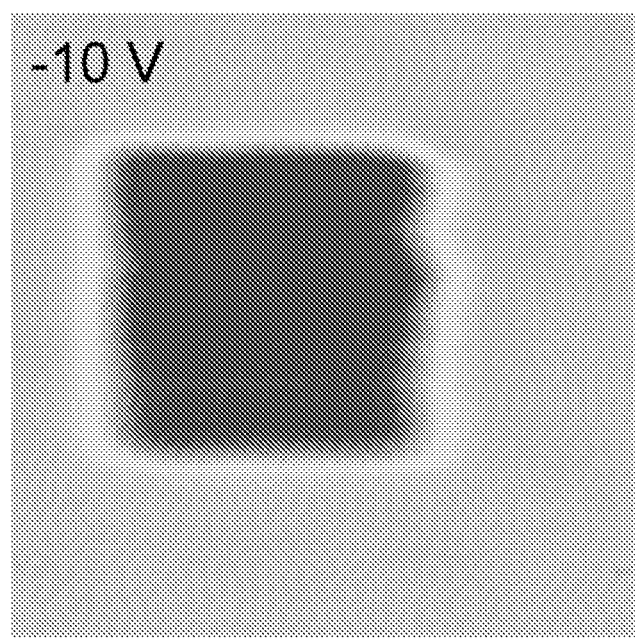
FIG. 5 shows a schematic diagram of a charge density of a material surface measured by a microscope according to an embodiment of the present disclosure.

FIG. 5 shows a schematic diagram of a charge density of a material surface measured by a microscope. A bias voltage of −10V is applied between the probe and the sample material in advance to produce charges on the surface of the sample material, and then the charge density of the surface of the sample material is measured using the method according to the embodiments of the present disclosure. In FIG. 5, the shade of the color indicates a magnitude of the charge density, and the darker the color, the greater the charge density.

Figure 6:
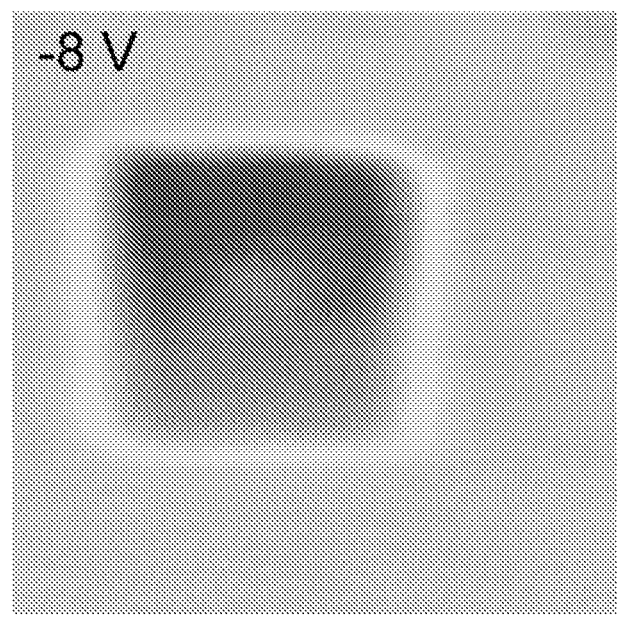
FIG. 6 shows a schematic diagram of a charge density of a material surface measured by a microscope according to an embodiment of the present disclosure.

FIG. 6 shows a schematic diagram of a charge density of a material surface measured by a microscope according to an embodiment of the present disclosure. A bias voltage of −8V is applied between the probe and the sample material in advance to produce charges on the surface of the sample material, and then the charge density of the surface of the sample material is measured using the method according to the embodiments of the present disclosure. In FIG. 6, the shade of the color indicates a magnitude of the charge density, and the darker the color, the greater the charge density.

Figure 7:
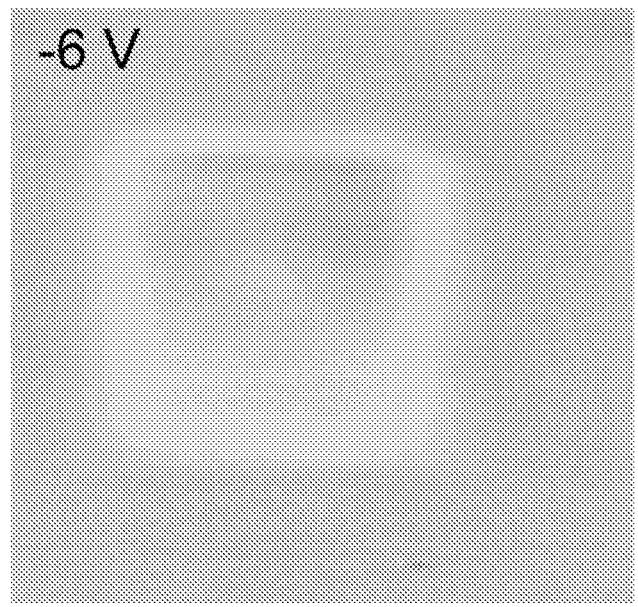
FIG. 7 shows a schematic diagram of a charge density of a material surface measured by a microscope according to an embodiment of the present disclosure.

FIG. 7 shows a schematic diagram of a charge density of a material surface measured by a microscope according to an embodiment of the present disclosure. A bias voltage of −6V is applied between the probe and the sample material in advance to produce charges on the surface of the sample material, and then the charge density of the surface of the sample material is measured using the method according to the embodiments of the present disclosure. In FIG. 7, the shade of the color indicates a magnitude of the charge density, and the darker the color, the greater the charge density.

Figure 8:
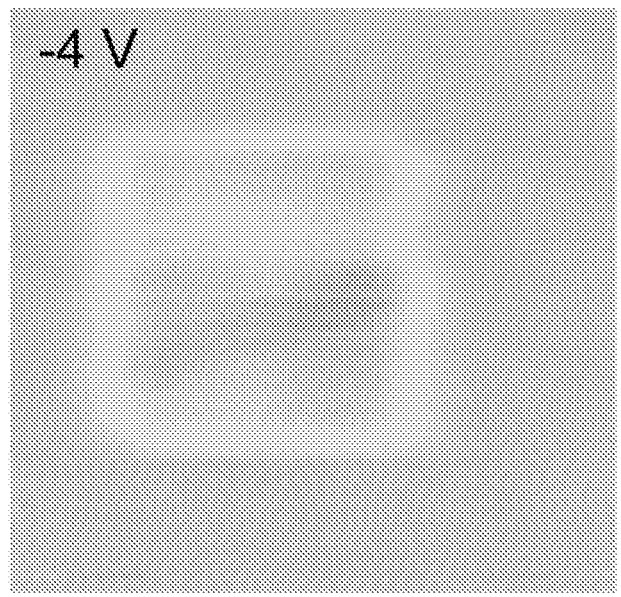
FIG. 8 shows a schematic diagram of a charge density of a material surface measured by a microscope according to an embodiment of the present disclosure.

FIG. 8 shows a schematic diagram of a charge density of a material surface measured by a microscope according to an embodiment of the present disclosure. A bias voltage of −4V is applied between the probe and the sample material in advance to produce charges on the surface of the sample material, and then the charge density of the surface of the sample material is measured using the method according to the embodiments of the present disclosure. In FIG. 8, the shade of the color indicates a magnitude of the charge density, and the darker the color, the greater the charge density.

Figure 9:
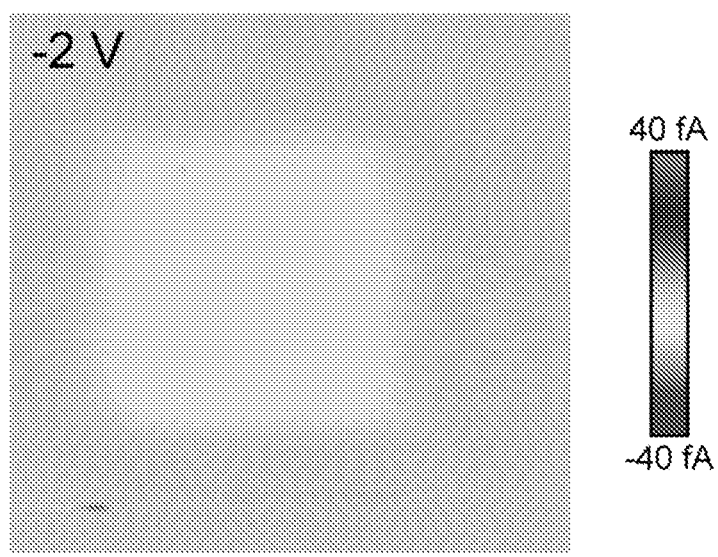
FIG. 9 shows a schematic diagram of a charge density of a material surface measured by a microscope according to an embodiment of the present disclosure.

FIG. 9 shows a schematic diagram of a charge density of a material surface measured by a microscope. A bias voltage of −2V is applied between the probe and the sample material in advance to produce charges on the surface of the sample material, and then the charge density of the surface of the sample material is measured using the method according to the embodiments of the present disclosure. In FIG. 9, the shade of the color indicates a magnitude of the charge density, and the darker the color, the greater the charge density.

From the above-described FIG. 5, FIG. 6, FIG. 7, FIG. 8 and FIG. 9, it may be determined that the greater the bias voltage applied between the probe and the sample material, the darker the color in the figures, which indicates there are more charges on the surface of the sample material.

Embodiment 5

Figure 10:
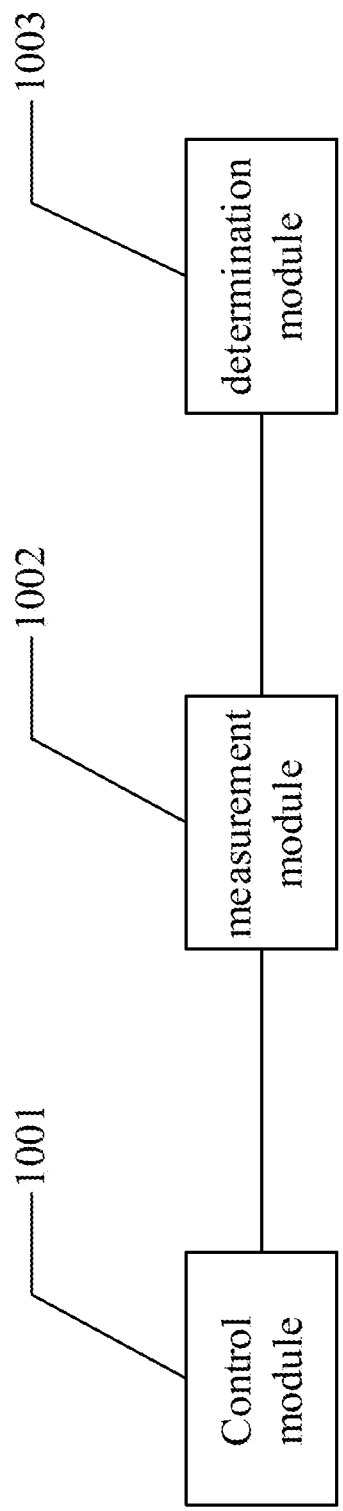
FIG. 10 shows a schematic diagram of a structure of an apparatus for measuring electrical properties of a sample material according to an embodiment of the present disclosure.

On the basis of the above-mentioned embodiments, FIG. 10 shows a schematic diagram of a structure of an apparatus for measuring electrical properties of a sample material according to an embodiment of the present disclosure, the apparatus including:
  a control module 1001 configured to apply an alternating voltage to a piezoelectric ceramic so that a probe fixed on the piezoelectric ceramic vibrates above a surface of the sample material;
  a measurement module 1002 configured to measure a target contact potential difference between the probe and the sample material, and determine a target amplitude of an induced alternating current generated due to the vibration of the probe above the surface of the sample material; and
  a determination module 1003 configured to determine a target work function of the surface of the sample material according to the target contact potential difference and a determined work function of the probe, and determine a target charge density of the surface of the sample material according to the target amplitude, the target contact potential difference, and a pre-stored target amplitude determination function for the induced alternating current.

Further, the measurement module is specifically configured to measure a target induced alternating current having the same frequency as a resonant frequency of the probe, and take an amplitude of the target induced alternating current as the target amplitude.

Further, the determination module is specifically configured to determine a difference between the work function of the probe and the target contact potential difference according to the target contact potential difference and the determined work function of the probe, and determine the difference as the target work function of the surface of the sample material.

Further, the determination module is specifically configured to determine the target charge density σ of the surface of the sample material according to the pre-stored target amplitude determination function for the target induced alternating current:

$$A_{charge/\omega} = \left(\frac{1}{\sqrt{1-\left(\frac{A_0}{\frac{d}{\varepsilon}+h}\right)^2}} - 1\right) \frac{2\left(\frac{\sigma d}{\varepsilon} + \varepsilon_0 V_{CPD}\right)S\omega}{A_0},$$

the target amplitude $A_{charge/\omega}$, and the target contact potential difference $V_{CPD}$, where h is a predetermined surface topography of the sample material and a preset height between the probe and the sample material, ω is a determined resonant frequency of the probe, $A_0$ is a determined amplitude of the probe, d is a determined thickness of a dielectric, $\varepsilon_0$ is the determined vacuum dielectric constant, ε is a determined relative dielectric constant, and S is an equivalent area of a tip of the probe.

Embodiment 6

Figure 11:
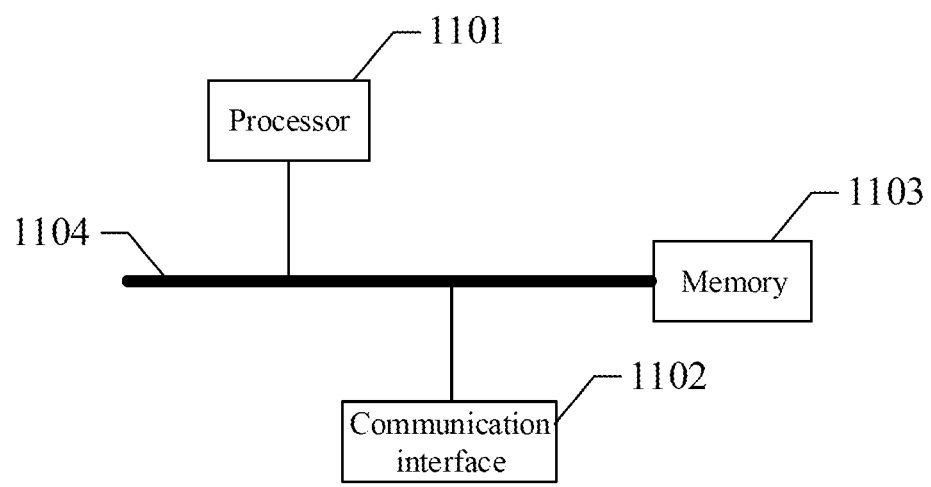
FIG. 11 shows a schematic diagram of a structure of an electronic device according to an embodiment of the present disclosure.

FIG. 11 shows a schematic diagram of a structure of an electronic device according to an embodiment of the present disclosure. On the basis of the above-mentioned embodiments, an embodiment of the present disclosure further provides an electronic device, including a processor 1101, a communication interface 1102, a memory 1103, and a communication bus 1104, where the processor 1101, the communication interface 1102, and the memory 1103 communicate with each other through the communication bus 1104.

The memory 1103 stores a computer program, and the program, when executed by the processor 1101, causes the processor 1101 to perform the following steps.

An alternating voltage is applied to a piezoelectric ceramic so that a probe fixed on the piezoelectric ceramic vibrates above a surface of the sample material;
a target contact potential difference between the probe and the sample material is measured, and a target amplitude of an induced alternating current generated due to the vibration of the probe above the surface of the sample material is determined; and
a target work function of the surface of the sample material is determined according to the target contact potential difference and a determined work function of the probe, and a target charge density of the surface of the sample material is determined according to the target amplitude, the target contact potential difference, and a pre-stored target amplitude determination function for the induced alternating current.

Further, that the processor 1101 is specifically configured to determine the target amplitude of the induced alternating current generated due to the vibration of the probe above the surface of the sample material includes the following steps.

A target induced alternating current having the same frequency as a resonant frequency of the probe is measured; and
an amplitude of the target induced alternating current is taken as the target amplitude.

Further, that the processor 1101 is specifically configured to determine the target work function of the surface of the sample material according to the target contact potential difference and the determined work function of the probe includes the following step.

A difference between the work function of the probe and the target contact potential difference is determined according to the target contact potential difference and the determined work function of the probe, and the difference is determined as the target work function of the surface of the sample material.

Further, that the processor 1101 is specifically configured to determine the target charge density of the surface of the sample material according to the target amplitude, the target contact potential difference, and the pre-stored target amplitude determination function for the induced alternating current includes the following step.

The target charge density σ of the surface of the sample material is determined according to the pre-stored target amplitude determination function for the target induced alternating current:

$$A_{charge/\omega} = \left(\frac{1}{\sqrt{1-\left(\frac{A_0}{\frac{d}{\varepsilon}+h}\right)^2}} - 1\right) \frac{2\left(\frac{\sigma d}{\varepsilon} + \varepsilon_0 V_{CPD}\right)S\omega}{A_0},$$

the target amplitude $A_{charge/\omega}$, and the target contact potential difference $V_{CPD}$, where h is a predetermined surface topography of the sample material and a preset height between the probe and the sample material, ω is a determined resonant frequency of the probe, $A_0$ is a determined amplitude of the probe, d is a determined thickness of a dielectric, $\varepsilon_0$ is a determined vacuum dielectric constant, ε is a determined relative dielectric constant, and S is an equivalent area of a tip of the probe.

The communication bus mentioned in the electronic device may be a Peripheral Component Interconnect (PCI) bus, an Extended Industry Standard Architecture (EISA) bus, or the like. The communication bus may be divided into an address bus, a data bus, a control bus, and the like. For ease of presentation, only a thick line is used in the figure to represent, however, this is not intended to represent there is only one bus or one type of bus.

The communication interface 1102 is used for communication between the electronic device and other devices.

The memory may include a random access memory (RAM) or a non-volatile memory (NVM), such as at least one disk memory. Alternatively, the memory may be at least one storage device located remotely from the aforementioned processor.

The above-mentioned processor may be a general-purpose processor, including a central processing unit, a network processor (NP), and the like; the processor may also be a digital signal processor (DSP), an application-specific integrated circuit, a field programmable gate array or other programmable logic devices, a discrete gate or transistor logic device, a discrete hardware component, or the like.

Embodiment 7

On the basis of the above-mentioned embodiments, an embodiment of the present disclosure further provides a non-temporary computer-readable storage medium storing a computer program, where the computer program, when executed by a processor, performs the following steps.

An alternating voltage is applied to a piezoelectric ceramic so that a probe fixed on the piezoelectric ceramic vibrates above a surface of the sample material;
 a target contact potential difference between the probe and the sample material is measured, and a target amplitude of an induced alternating current generated due to the vibration of the probe above the surface of the sample material is determined; and
 a target work function of the surface of the sample material is determined according to the target contact potential difference and a determined work function of the probe, and a target charge density of the surface of the sample material is determined according to the target amplitude, the target contact potential difference, and a pre-stored target amplitude determination function for the induced alternating current.

Further, that the target amplitude of the induced alternating current generated due to the vibration of the probe above the surface of the sample material is determined includes the following steps.

A target induced alternating current having the same frequency as a resonant frequency of the probe is measured; and
 an amplitude of the target induced alternating current is taken as the target amplitude.

Further, that the target work function of the surface of the sample material is determined according to the target contact potential difference and the determined work function of the probe includes the following step.

A difference between the work function of the probe and the target contact potential difference is determined according to the target contact potential difference and the determined work function of the probe, and the difference is determined as the target work function of the surface of the sample material.

Further, that the target charge density of the surface of the sample material is determined according to the target amplitude, the target contact potential difference, and the pre-stored target amplitude determination function for the induced alternating current includes the following step.

The target charge density σ of the surface of the sample material is determined according to the pre-stored target amplitude determination function for the target induced alternating current:

$$A_{charge/\omega} = \left( \frac{1}{\sqrt{1 - \left(\frac{A_0}{\frac{d}{\varepsilon}+h}\right)^2}} - 1 \right) \frac{2\left(\frac{\sigma d}{\varepsilon} + \varepsilon_0 V_{CPD}\right) S\omega}{A_0},$$

the target amplitude $A_{charge/\omega}$, and the target contact potential difference $V_{CPD}$, where h is a predetermined surface topography of the sample material and a preset height between the probe and the sample material, ω is a determined resonant frequency of the probe, $A_0$ is a determined amplitude of the probe, d is a determined thickness of a dielectric, $\varepsilon_0$ is a determined vacuum dielectric constant, ε is a determined relative dielectric constant, and S is an equivalent area of a tip of the probe.

Those skilled in the art will appreciate that the embodiments of the present disclosure may provide a method, a system, or a computer program product. Therefore, the present disclosure may take the form of an entirely hardware embodiment, an entirely software embodiment, or an embodiment combining software and hardware aspects. Furthermore, the present application may take the form of a computer program product embodied on one or more computer-usable storage mediums (including, but not limited to, a disk storage, a CD-ROM, an optical storage, and the like) having a computer-usable program code embodied therein.

The present application is described with reference to flowchart diagrams and/or block diagrams of the method, apparatus (system), and computer program product according to the present disclosure. It will be understood that each flow and/or block in the flowchart diagrams and/or block diagrams, and a combination of flows and/or blocks in the flowchart diagrams and/or block diagrams may be implemented by computer program instructions. These computer program instructions may be provided to a processor of a general-purpose computer, special-purpose computer, embedded processor, or other programmable data processing devices so as to produce a machine, so that instructions executed by the processor of the computer or other programmable data processing devices produce means for implementing functions specified in one or more flows of the flowcharts and/or one or more blocks of the block diagrams.

These computer program instructions may also be loaded on a computer-readable memory that may direct a computer or other programmable data processing devices to function in a particular manner, so that the instructions stored in the computer-readable memory produce an article of manufacture including instruction means which implement the functions specified in a flow or flows of the flowcharts and/or a block or blocks of the block diagrams.

These computer program instructions may also be loaded onto a computer or other programmable data processing devices, causing a series of operational steps to be performed on the computer or other programmable devices to produce a computer-implemented process, so that the instructions executed by the computer or other programmable devices provide steps for implementing functions specified in one or more flows of the flowcharts and/or one or more blocks of the block diagrams.

It will be apparent that those skilled in the art may make various changes and modifications to the present application without departing from the spirit and scope of the present application. In this way, if these modifications and variations of the present application fall within the scope of the claims of the present application and their equivalents, the present application is also intended to include these modifications and variations.

What is claimed is:

1. A method for measuring electrical properties of a sample material performed by a microscope, comprising:
 applying an alternating voltage to a piezoelectric ceramic so that a probe fixed on the piezoelectric ceramic has vibration above a surface of the sample material, wherein the piezoelectric ceramic in the microscope has a length between 1 mm and 8 mm, a width between 1 mm and 4 mm, and a thickness between 1 mm and 3 mm, and wherein a radius of a tip of the probe is between tens of nanometers and several micrometers, the probe is a probe coated with a metal thin film, a probe coated with conductive diamond, or an all-metal probe;

measuring a target contact potential difference between the probe and the sample material, and determining a target amplitude of an induced alternating current generated due to the vibration of the probe above the surface of the sample material; and determining a target work function of the surface of the sample material according to the target contact potential difference and a determined work function of the probe, and determining a target charge density of the surface of the sample material according to the target amplitude, the target contact potential difference, and a pre-stored target amplitude determination function for the induced alternating current, wherein the determining a target charge density of the surface of the sample material according to the target amplitude, the target contact potential difference, and a pre-stored target amplitude determination function for the induced alternating current comprises:

determining the target charge density σ of the surface of the sample material according to the pre-stored target amplitude determination function for the target induced alternating current:

$$A_{\underline{charge}\atop\omega} = \frac{\left(\frac{1}{\sqrt{1-\left(\frac{A_0}{\frac{d}{\varepsilon}+h}\right)^2}}-1\right)2\left(\frac{\sigma d}{\varepsilon}+\varepsilon_0 V_{CPD}\right)S\omega}{A_0},$$

the target amplitude $$A_{\underline{charge}\atop\omega},$$

and the target contact potential difference $V_{CPD}$, wherein h is a predetermined surface topography of the sample material and a preset height between the probe and the sample material, ω is a determined resonant frequency of the probe, $A_0$ is a determined amplitude of the probe, d is a determined thickness of a dielectric, $\varepsilon_0$ is a determined vacuum dielectric constant, ε is a determined relative dielectric constant, and S is an equivalent area of a tip of the probe.

2. The method according to claim 1, wherein the determining a target amplitude of an induced alternating current generated due to the vibration of the probe above the surface of the sample material comprises:

measuring a target induced alternating current having a same frequency as a resonant frequency of the probe; and taking an amplitude of the target induced alternating current as the target amplitude.

3. The method according to claim 1, wherein the determining a target work function of the surface of the sample material according to the target contact potential difference and a determined work function of the probe comprises:

determining a difference between the determined work function of the probe and the target contact potential difference according to the target contact potential difference and the determined work function of the probe, and determining the difference as the target work function of the surface of the sample material.

4. An apparatus for measuring electrical properties of a sample material, comprising:

a control module configured to apply an alternating voltage to a piezoelectric ceramic so that a probe fixed on the piezoelectric ceramic has vibration above a surface of the sample material, wherein the piezoelectric ceramic in a microscope has a length between 1 mm and 8 mm, a width between 1 mm and 4 mm, and a thickness between 1 mm and 3 mm, and wherein a radius of a tip of the probe is between tens of nanometers and several micrometers, the probe is a probe coated with a metal thin film, a probe coated with conductive diamond, or an all-metal probe;

a measurement module configured to measure a target contact potential difference between the probe and the sample material, and determine a target amplitude of an induced alternating current generated due to the vibration of the probe above the surface of the sample material; and a determination module configured to determine a target work function of the surface of the sample material according to the target contact potential difference and a determined work function of the probe, and determine a target charge density of the surface of the sample material according to the target amplitude, the target contact potential difference, and a pre-stored target amplitude determination function for the induced alternating current, wherein the determination module is specifically configured to determine the target charge density σ of the surface of the sample material according to the pre-stored target amplitude determination function for the target induced alternating current:

$$A_{\underline{charge}\atop\omega} = \frac{\left(\frac{1}{\sqrt{1-\left(\frac{A_0}{\frac{d}{\varepsilon}+h}\right)^2}}-1\right)2\left(\frac{\sigma d}{\varepsilon}+\varepsilon_0 V_{CPD}\right)S\omega}{A_0},$$

the target amplitude $$A_{\underline{charge}\atop\omega},$$

and the target contact potential difference $V_{CPD}$, wherein h is a predetermined surface topography of the sample material and a preset height between the probe and the sample material, ω is a determined resonant frequency of the probe, $A_0$ is a determined amplitude of the probe, d is a determined thickness of a dielectric, $\varepsilon_0$ is a determined vacuum dielectric constant, ε is a determined relative dielectric constant, and S is an equivalent area of a tip of the probe.

5. The apparatus according to claim 4, wherein the measurement module is specifically configured to measure a target induced alternating current having a same frequency as a resonant frequency of the probe, and take an amplitude of the target induced alternating current as the target amplitude.

6. The apparatus according to claim 4, wherein the determination module is specifically configured to determine a difference between the determined work function of the probe and the target contact potential difference according to the target contact potential difference and the determined work function of the probe, and determine the difference as the target work function of the surface of the sample material.

7. An electronic device comprising:
   a processor; and
   a memory,
   wherein the memory is configured to store program instructions and the processor is configured to implement operations of the method for measuring electrical properties of a sample material according to claim 1 when the program instructions stored in the memory are executed.

8. A non-transitory computer-readable storage medium storing a computer program, wherein the computer program, when executed by a processor, implements operations of the method for measuring electrical properties of a sample material according to claim 1.

* * * * *